US005164221A

United States Patent [19]

Someno et al.

[11] Patent Number: 5,164,221

[45] Date of Patent: Nov. 17, 1992

[54] FORMING DIE MANUFACTURING METHOD

[75] Inventors: Yoshihiro Someno, Miyagi; Toshio Hirai; Makoto Sasaki, both of Sendai, all of Japan

[73] Assignee: Alps Electric Co., Ltd., Tokyo, Japan

[21] Appl. No.: 638,240

[22] Filed: Jan. 4, 1991

[30] Foreign Application Priority Data

Jan. 12, 1990 [JP] Japan ................................ 2-4885

[51] Int. Cl.$^5$ ................................ B05D 3/02
[52] U.S. Cl. .................... 427/575; 427/133; 427/255.2; 427/255.3
[58] Field of Search .......... 156/278; 264/81; 427/35, 38, 45.1, 133, 255.2, 255.3

[56] References Cited

U.S. PATENT DOCUMENTS

| | | | |
|---|---|---|---|
| 4,030,942 | 6/1977 | Keenan et al. | 148/1.5 |
| 4,436,770 | 3/1984 | Nishizawa et al. | 427/39 |
| 4,724,159 | 2/1988 | Yamazaki | 427/451 |
| 4,926,791 | 5/1990 | Hirose et al. | 427/45.1 |
| 5,039,548 | 8/1991 | Hirose et al. | 427/45.1 |

FOREIGN PATENT DOCUMENTS 61-197430A 9/1986 Japan.

Primary Examiner—James Lowe
Assistant Examiner—Christopher A. Fiorilla
Attorney, Agent, or Firm—Guy W. Shoup; David W. Heid

[57] ABSTRACT

A manufacturing method of a forming die includes the steps of depositing a film of aluminum nitride or aluminum oxynitride on the forming surface of a forming member by passing an electric discharge through a mixture gas of halide of aluminum and a gas containing nitrogen atoms and hydrogen atoms or a mixture gas of halide of aluminum, a gas containing nitrogen atoms and a gas containing oxygen atoms by the application of a microwave and thereby ionizing the mixture gas, and fixing such a forming member on a die.

9 Claims, 5 Drawing Sheets

FORMING DIE MANUFACTURING METHOD

BACKGROUND OF THE INVENTION

1. Field of the Invention

The present invention relates to the manufacture of a forming die used to form optical glass devices such as objective lenses incorporated in an optical pick up. Particularly, the present invention is directed to the manufacture of a forming die in which the forming surface of a forming member can be coated with a film of aluminum nitride (AlN) or aluminum oxynitride ($Al_xO_yN_z$) which provides a high surface roughness at relatively low temperatures so as to achieve a forming surface which has high adhesion, heat-resistance and low surface roughness and a small wettability to a forming material such as a glass.

2. Description of the Related Art

In the forming die used to form optical glass devices such as objectives, a certain type of film is generally coated on the forming surface thereof to improve the surface characteristics thereof, such as the die releasing characteristics. For example, Japanese Patent Laid Open No. 197430/1986 discloses a forming die whose forming surface is coated with a film made of aluminum nitride (AlN) so that it exhibits improved die releasing characteristics (wettability) and heat resistance at high temperatures. In this technique, the film of AlN is formed using PVD (physical vapor deposition) such as sputtering or ion plating.

However, in the deposition of a film made of AlN by the physical vapor deposition process, there is a limitation to the improvement in the surface roughness of the coated film.

Regarding deposition of a thin AlN film by the CVD (chemical vapor deposition) process, monthly magazine, "Industrial Material" (published by Nikkan Kogyo Shinbunsha) describes on page 55 of No. 9, Vol 31 that AlN can be deposited on a substrate of SiC at a temperature from 1200 to 1250° C. by the CVD process using a mixture gas of aluminum chloride (AlCl3) and ammonia (NH3). In this described technique, however, deposition is possible only at high temperatures ranging from 1200 to 1250° C. Furthermore, the films formed by the above technique have a rough surface. Particularly, deposition of AlN on the surface of a forming member made of a super hard material at such high temperatures, which is conducted when a heating type forming die is manufactured, deteriorates the super hard material. Furthermore, a forming die whose surface is rough cannot be used as the heating type forming die.

Substantially no research has been ever made on the deposition of aluminum oxynitride ($Al_xO_yN_z$) which is known as excellent a material as aluminum nitride (AlN) in terms of heat-resistance and optical characteristics. In the reports exceptionally made on the research, however, the use of thermal CVD has been reported. This technique requires a substrate having a very high temperatures. Deposition of $Al_xO_yN_z$ on the surface of a forming member made of a super hard material at high temperatures, which is necessary to manufacture a heating type forming die, deteriorates the super hard material.

SUMMARY OF THE INVENTION

In view of the aforementioned problems of the conventional techniques, an object of the present invention is to provide a manufacturing method of a forming die in which a film of aluminum nitride (AlN) or aluminum oxynitride ($Al_xO_yN_z$), which provides excellent surface roughness at relatively low temperatures, can be deposited on the forming surface of a forming member so as to enhance the adhesion (strength), heat-resistance and lower surface roughness of the forming surface and reduce the wettability thereof relative to a forming material such as glass.

To this end, the present invention provides a manufacturing method of a forming die which comprises the steps of depositing a film of aluminum nitride on the forming surface of a forming member by passing an electric discharge through a mixture gas of halide of aluminum and a gas containing nitrogen atoms and hydrogen atoms by the application of a microwave and thereby ionizing the mixture gas, and fixing such a forming member on a die.

The present invention further provides a manufacturing method of a forming die which comprises the steps of depositing a film of aluminum oxynitride on the forming surface of a forming member by passing an electric discharge through a mixture gas of halide of aluminum, a gas containing nitrogen atoms and a gas containing oxygen atoms by the application of a microwave and thereby ionizing the mixture gas, and fixing such a forming member on a die.

In the present invention, an electric discharge is passed through a mixture gas to ionize the mixture gas by the application of a microwave of, for example, 2.45 GHz. This results in deposition of aluminum nitride or aluminum oxynitride at a low temperature of 500° C. or below. This present invention is achieved when the present inventors noticed that excitation of ionized gas is concerned with the dielectric constant and dielectric loss angle of a substance. That is, when an electric discharge is passed through a mixture gas of aluminum bromide ($AlBr_3$), which is a source gas, nitrogen gas ($N_2$), and hydrogen gas ($H_2$) or (nitrous oxide) gas ($N_2O$) as a consequence of application of a microwave, ionization of the mixture gas takes place, and radicals and ions of Al and Br, N and H, Al and N, Al and O, Al, Br and H are thereby produced. At that time, when the frequency of the microwave applied is, for example, 2.45 GHz, the dielectric constant and dielectric loss angle of the gas are affected by the microwave and the radicals and ions of the above-described combinations are tuned to resonance. In consequence, the radicals and ions are separated into elements and these elements, such as Al, N and O, are thus present in the plasma in a thermodynamically balanced state. These separate elements react with the forming surface of the forming member, by which a thin film of aluminum nitride or aluminum oxynitride is formed on the forming surface. In that case, it is possible to form a thin film of aluminum nitride or aluminum oxynitride at a low temperature of about 430° C. by setting the molar ratio of $AlBr_3$ to $N_2$ to an optimum value (e.g., a molar ratio of $N_2$ to $AlBr_3$ of about 15). The resultant thin film exhibits a very low surface roughness.

DESCRIPTION OF THE PREFERRED EMBODIMENTS

An embodiment of the present invention will now be described with reference to the accompanying drawings.

First, an example of a lens forming die which can be manufactured by the forming die manufacturing method according to the present invention will be described below with reference to FIG. 4.

Figure 3:
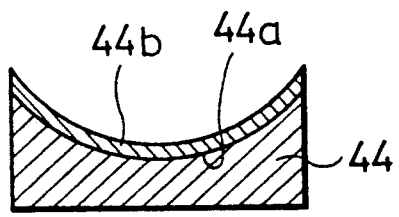
FIG. 3 is a cross-sectional view of a forming member with a film of aluminum nitride or aluminum oxynitride formed on the forming surface thereof.

A forming die is composed of an upper die 31, a lower die 32, a core 41 to be disposed within the upper die 31 in such a manner as to be movable up and down, a core 42 to be disposed within the lower die 32 in such a manner as to be movable up and down, a forming member 43 fixed to the distal end of the core 41 by means of, for example, an adhesive, a lower end surface (a forming surface) 43a of the forming member 43 being formed in a convex fashion, and a forming member 44 fixed to the distal end of the core 42 by means of, for example, an adhesive, an upper end surface (a forming surface) 44a of the forming member 44 being formed in a concave fashion. The forming members 43 and 44 and the cores 41 and 43 are made of a highly heat resistant and strong super hard material. The upper end surface (the forming surface) 44a of the forming member 44 is coated with a film 44b of aluminum nitride or aluminum oxynitride, as shown in FIG. 3. The lower end surface (the forming surface) 43a of the forming member 43 is also coated with a film 43b of aluminum nitride (AlN) or aluminum oxynitride ($Al_xO_yN_z$).

When a lens is to be formed by glass pressing, a glass material softened by the heating is supplied between the forming members 43 and 44. Thereafter, one of the pair of cores 41 and 42 or both of the cores 41 and 42 are moved toward each other to press the glass material, by means of which an aspherical or spherical optical surface of the forming surfaces 43a and 44a of the forming members 43 and 44 are transferred onto a lens 40.

Since the forming surfaces 43a and 44a are exposed to the high-temperature glass material in the above-described lens pressing process, they must be highly heat resistant. Also, the forming surfaces 43a and 44a must be fine to make the optical surface of a lens to be formed by them highly precise. Also, the forming surfaces 43a and 44a should not be readily attached to the glass material (should have a low wettability). Also, since pressing of the lens is conducted with the forming surfaces 43a and 44a, the forming surfaces should be sufficiently strong.

Next, a plasma CvD apparatus used to form a film of aluminum nitride on the forming surface 44a (or 43a) of the forming member 44 (or 43) and a method therefor will be described below with reference to FIG. 1.

Figure 1:
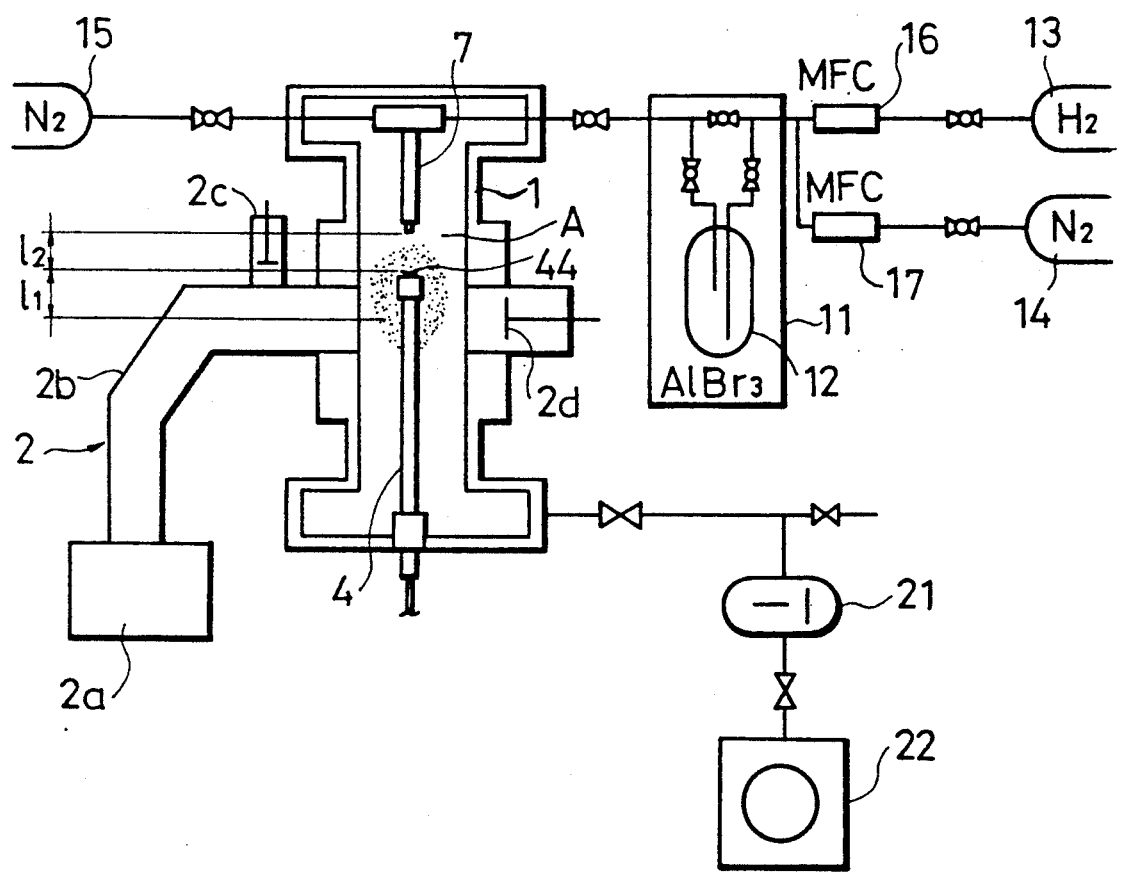
FIG. 1 is a cross sectional view of a CVD apparatus used to form a film of aluminum nitride on the forming surface of a forming member.

In FIG. 1, a reference numeral 1 denotes a reaction tube which may be a quartz tube whose interior forms a reaction chamber A. A reference numeral 2 denotes a microwave plasma generating device; 2a, a microwave oscillator for generating a microwave of 2.45 GHz. In this embodiment, the microwave oscillator is a cyclotron; 2b, a waveguide; 2c, a matching unit; and 2d, a reflecting plate. The forming member 44 (or 43) is placed on a supporting member 4 within the reaction chamber A.

A gas supply nozzle 7 is disposed in the upper end portion of the reaction chamber A. The gas supply nozzle 7 is a multi-skinned tube. In this embodiment, the gas supply nozzle is a double-skinned tube. A source supply portion includes a constant-temperature chamber 11 in which a bubbler 12 is disposed. The bubbler 12 contains aluminum bromide ($AlBr_3$) which serves as a reactive gas source. A reference numeral 13 denotes a bomb of hydrogen gas ($H_2$) which is an introduced gas; 14, a bomb of nitrogen gas ($N_2$); 15, a bomb of nitrogen gas ($N_2$); and 16 and 17, flow rate adjusters. The gas supplied from the bubbler 12 enters the reaction chamber A from an inner tube of the double-skinned gas supply nozzle 7. In a case where the bomb 15 is used, the nitrogen gas supplied from the bomb 15 enters the reaction chamber A from an outer tube of the gas supply nozzle 7. A reference numeral 21 denotes a mechanical booster pump; and 22, a rotary pump. The reaction chamber A is evacuated by either of the two pumps.

In this embodiment, the surface of the forming member 44 is higher by l1 than the center of the passage of the microwave, and the lower end of the gas supply nozzle 7 is higher by l2 than the surface of the forming member 44. Both l1 and l2 are set to 40 mm. If the forming member 44 is located at a lower position than the above-described one, the deposited AlN will be readily decomposed. Lowering of the gas supply nozzle allows a film to be readily formed on the inner surface of the nozzle.

In this CVD apparatus, an electric discharge is passed through a mixture gas to ionize the mixture gas by the application of a microwave of, for example, 2.45 GHz. This results in deposition of aluminum nitride or aluminum oxynitride at a low temperature of 500° C. or below. This present invention is achieved when the present inventors noticed that excitation of ionized gas is concerned with the dielectric constant and dielectric loss angle of a substance. That is, when an electric discharge is passed through a mixture gas of aluminum bromide ($AlBr_3$), which is a source gas, nitrogen gas ($N_2$), and hydrogen gas ($H_2$) as a consequence of application of a microwave, ionization of the mixture gas takes place, and radicals and ions of Al and Br, N and H, Al and N, Al and 0, Al, Br and H are thereby produced. At that time, when the frequency of the microwave applied is, for example, 2.45 GHz, the dielectric constant and dielectric loss angle of the gas are affected by the microwave and the radicals and ions of the above-described combinations are tuned to resonance. In consequence, the radicals and ions are separated into elements and these elements, such as Al, N and 0, are thus present in the plasma in a thermodynamically balanced state. These separate elements react with the forming surface 44a of the forming member 44, by which a thin film of aluminum nitride or aluminum oxynitride is formed on the forming surface. In that case, it is possible to form a thin film of polycrystal aluminum nitride whose Miller index is (OOl) at a low temperature of about 430° C. by setting the molar ratio of $AlBr_3$ to $N_2$ to an optimum value (e.g., a molar ratio of $N_2$ to $AlBr_3$ of about 15). The resultant thin film exhibits a very low surface roughness.

Figure 2:
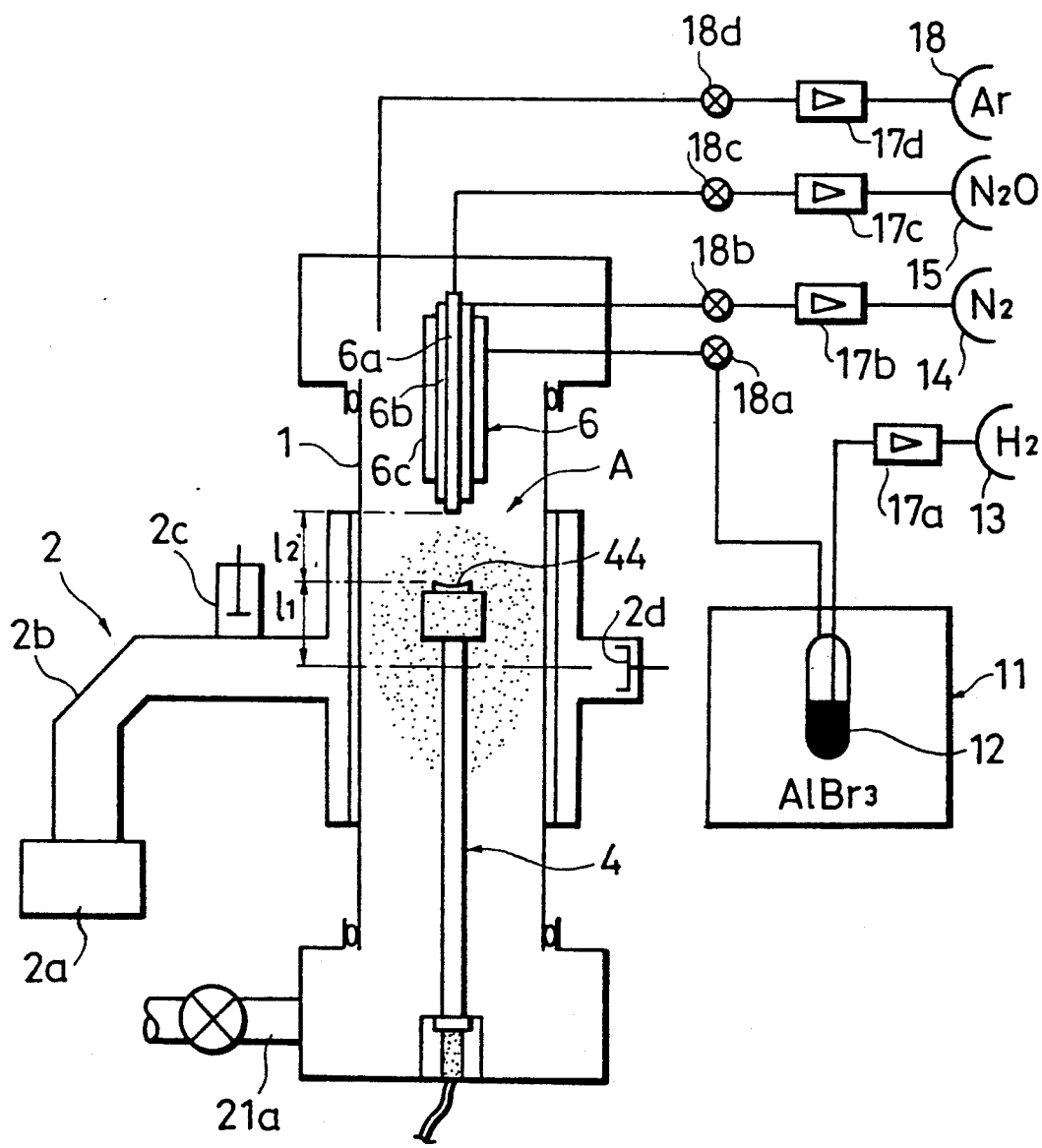
FIG. 2 is a cross-sectional view of a CVD apparatus used to form a film of aluminum oxynitride on the forming surface of a forming member.

Next, a plasma CVD apparatus used to form a film of aluminum oxynitride on the forming surface 44a (or 43a) of the forming member 44 (or 43) and a method therefor will be described below with reference to FIG. 2. In FIG. 2, the same reference numerals are used to denote parts which are the same as those of FIG. 1.

In FIG. 2, a reference numeral 6 denotes a triple-skinned gas supply nozzle; 15, a bomb of nitrous oxide ($N_2O$) used to supply oxygen atoms; 18, a bomb of argon gas (Ar); 17a to 17d, flow rate adjusters; and 18a to 18d, valves.

Nitrous oxide ($N_2O$) enters the reaction chamber A from an innermost tube 6a of the triple-skinned gas supply nozzle 6. Nitrogen gas ($N_2$) and aluminum bromide ($AlBr_3$) are supplied into the reaction chamber A from an intermediate tube 6b and an outermost tube 6c of the gas supply nozzle 6, respectively. In this embodiment, since the individual gases are supplied to the reaction chamber A via the separate routes using the triple-skinned tube, mixture of the gases within the tube and deposition of a composition on the wall of the tube can be prevented.

Argon gas (Ar) is supplied into the reaction chamber A from an upper portion thereof (from an upper left portion thereof in FIG. 2) not through the gas supply nozzle 6 but via a separate route. This is done to supply argon gas into the interior of the reaction chamber A from the outside of a plasma generated area thereof. When argon gas is supplied into the plasma from the outside thereof, dissociation of the plasma into neutral particles, ions and electrons is accelerated. Furthermore, in the case of a coaxial line type microwave plasma CVD in which the plasma is readily affected by an electric field whose magnitude is large near the wall of the reaction chamber and small at the center of the chamber where the substrate to be reacted is placed, and thereby becomes non-uniform, supply of argon gas from the output of the plasma generated area enlarges the plasma generated area. The monoatomic molecules such as argon gas do not readily recombine once they are decomposed in the plasma. Even when they recombine, they do not need energy. Therefore, the monoatomic molecules maintain stable decomposed state It is estimated that the plasma generated area has been enlarged with these monoatomic molecules acting as ignition sources. The same effect may be accomplished by enhancing a degree of vacuum in the conventional plasma CVD. However, enhancement of the degree of vacuum is accompanied by a defect such as reduction in the film forming speed due to increase in the density of electrons, whereas the method of this invention is free from such a problem. Enlargement of the plasma generated area and enhancement of the radial dissociation provide stable film deposition and lead to increase in the film depositing speed.

The above effect can be achieved only when argon gas is supplied from the outside of the plasma generated area. Supply of argon gas directly on the substrate in the plasma from the nozzle is substantially sputtering of argon gas and reduces the film deposition speed.

The same effect can be ensured in the deposition of AlN by the CVD apparatus shown in FIG. 1 by supplying argon gas from the outside of the plasma generated area.

A reference numeral 21a denotes an evacuation pipe through which the interior of the reaction chamber A is evacuated. The evacuation pipe 21a is connected to a mechanical booster pump or a rotary pump.

In this embodiment, the surface of the substrate 44 is higher by 11 than the center of the passage of the microwave, and the lower end of the gas supply nozzle 6 is higher by 12 than the surface of the substrate. 11 and 12 are both set to 40 mm. In the reaction chamber A, not the center where a plasma is generated but the upper or lower portion of the interior thereof is the fastest film deposition area. Also, location of the substrate in the lower portion of the plasma generated area allows the outlet of the gas supply nozzle 6 to be located in the plasma generated area. This allows a film to be deposited on the inner surface of the nozzle.

In the CVD apparatus shown in FIG. 2, an electric discharge is passed through a mixture gas to ionize the mixture gas by the application of a microwave of, for example, 2.45 GHz. This results in deposition of aluminum oxynitride at a low temperature of 500° C. or below. This present invention is achieved when the present inventors noticed that the excitation of the ionized gas is concerned with dielectric constant and dielectric loss angle of a substance. That is, when an electric discharge is passed through a mixture gas of aluminum bromide ($AlBr_3$), which is a source gas, nitrogen gas ($N_2$), and (nitrous oxide) gas ($N_2O$) as a consequence of application of a microwave, ionization of the mixture gas takes place, and radicals and ions of Al and Br, N and H, Al and N, Al and 0, Al, Br and H are thereby produced. At that time, when the frequency of the microwave applied is, for example, 2.45 GHz, the dielectric constant and dielectric loss angle of the gas are affected by the microwave and the radicals and ions of the above-described combinations are tuned to resonance. In consequence, the radicals and ions are separated into elements and these elements, such as Al, N and 0, are thus present in the plasma in a thermodynamically balanced state. These separate elements react with the forming surface 44a or 43a of the forming member 44 or 43, by which a thin film of aluminum oxynitride is formed on the forming surface.

Thus, in the CVD apparatus shown in FIG. 2, aluminum bromide is used as the aluminum source and nitrous oxide gas is used as the nitrogen source to deposit a film of aluminum oxynitride by the plasma CVD.

Figure 4:
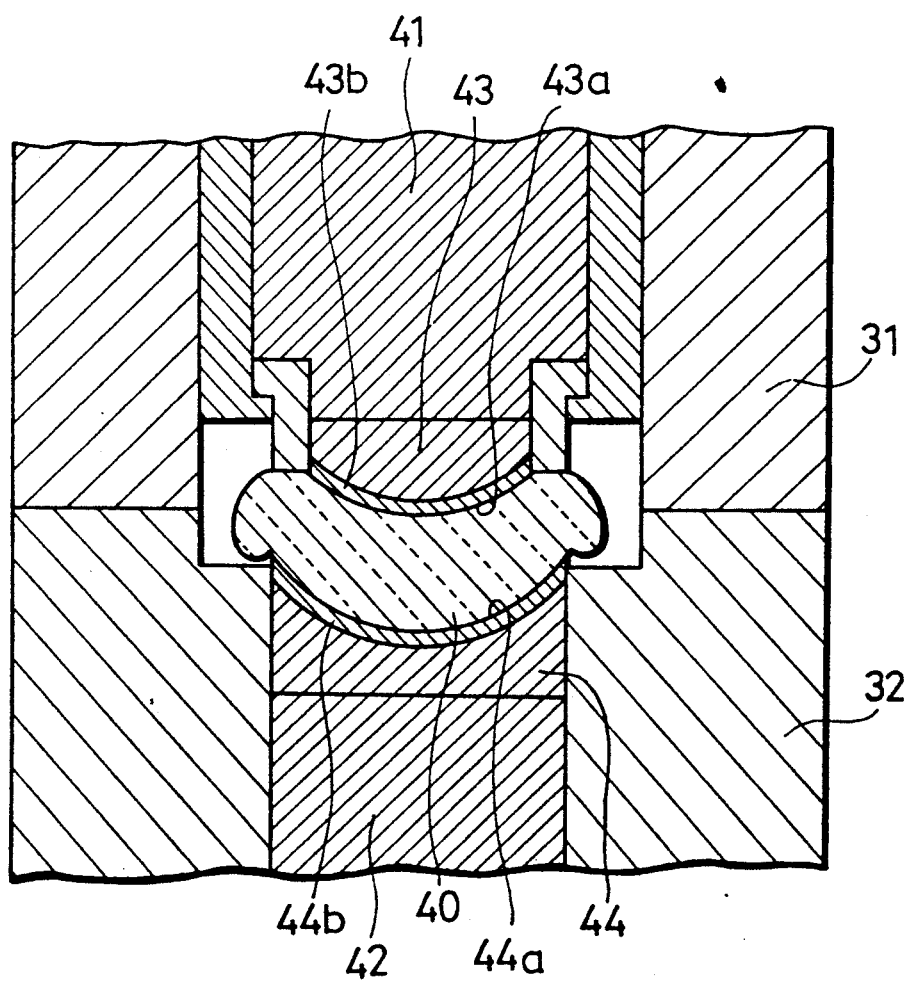
FIG. 4 is a cross-sectional view of a lens forming die with the forming member of FIG. 3 fixed thereto.

In the manufacturing method of a forming die according to the present invention, after the films 43b and 44b of aluminum nitride (AlN) or aluminum oxynitride ($Al_xO_yN_z$) have been formed on the forming surfaces 43a and 44a of the forming members 43 and 44, the forming members 43 and 44 are respectively fixed to the cores 41 and 43 by means of an adhesive or the like to manufacture a lens pressing die shown in FIG. 4.

Thus, the lens forming die which is manufactured in the present invention has a forming surface which has high strength (adhesion) (1), heat-resistance (2) and low surface roughness (3) and a low wettability to glass (4).

These characteristics will be examined below sequentially. First, the strength (1) will be studied. The strength (1) of the forming surface can be obtained by measuring the adhesion of the films coated on the forming surfaces 43a and 44a relative to the forming members (super hard material) 43 and 44. The following table shows the results of the scratch test conducted on the aluminum nitride (AlN) and aluminum oxynitride ($Al_xO_yN_z$) films 43b and 44b formed in the present invention and on the conventionally employed AlSiN film to examine adhesion of the respective films relative to the forming members (super hard material) 43 and 44.

| Sample No. | Peeling load (N) |
| --- | --- |
| 1-A (AlSiN) | 18 |
| 1-B (AlSiN) | 20 |
| 2-A (AlN) | 30 to 40 |
| 2-B (AlN) | 40 to 50 |
| 3 (AlON) | 42 |

In this scratch test conducted to examine adhesion, acoustic emission (AE) generated by scratching samples (films made of AlSiN, AlN and AlON) using a diamond cone having a radius of 0.2 mm at a scratching speed of 10 mm/min was detected, and the load applied to the sample when peeling occurred was measured. At that time, the stylus was moved in one test at a fixed load, and a different load was applied in each test.

As will be seen from the above table, the peeling of the film which occurred in sample 1 was quite different in its form from those in samples 2 and 3: spalling occurred in sample 1 (a thin piece of sample 1 peeled off over a large area thereof starting from the edge of a groove formed by scratching which was the starting point of the rupture) whereas small chips were generated on the edge of the groove formed by scratching in samples 2 and 3. Also, the magnitude of the AE signal generated by scratching in sample 1 was greater than those in samples 2 and 3 (the AE signal generated in sample 1 could be measured at AE sensitivity 2 whereas the volume had to be raised up to AE sensitivity 18 to 35 measure the AE signal in samples 2 and 3). These results of the measurements indicate that the film adheres to the forming member more firmly in samples 2 and 3 than in sample 1 and that the forming surface of the forming member in samples 2 and 3 therefore has a higher strength than in sample 1.

Regarding the heat-resistance (2), it was confirmed by the experiments that both the forming surfaces on which the films 43b and 44b made of aluminum nitride (AlN) and aluminum oxynitride ($Al_xO_yN_z$) were formed exhibited stable surface characteristics at 600° C. This is a great improvement when compared with the surface characteristics of the forming surface formed only by the super hard material which deteriorates at 600° C.

Regarding the surface roughness (3), it was confirmed that the surface roughness (contouring of th-surface) of the forming surfaces on which the films 43b and 44b made of aluminum nitride (AlN) and aluminum oxynitride ($Al_xO_yN_z$) were formed was almost the same as that made of super hard material on which super precision polishing was conducted.

Figure 5:
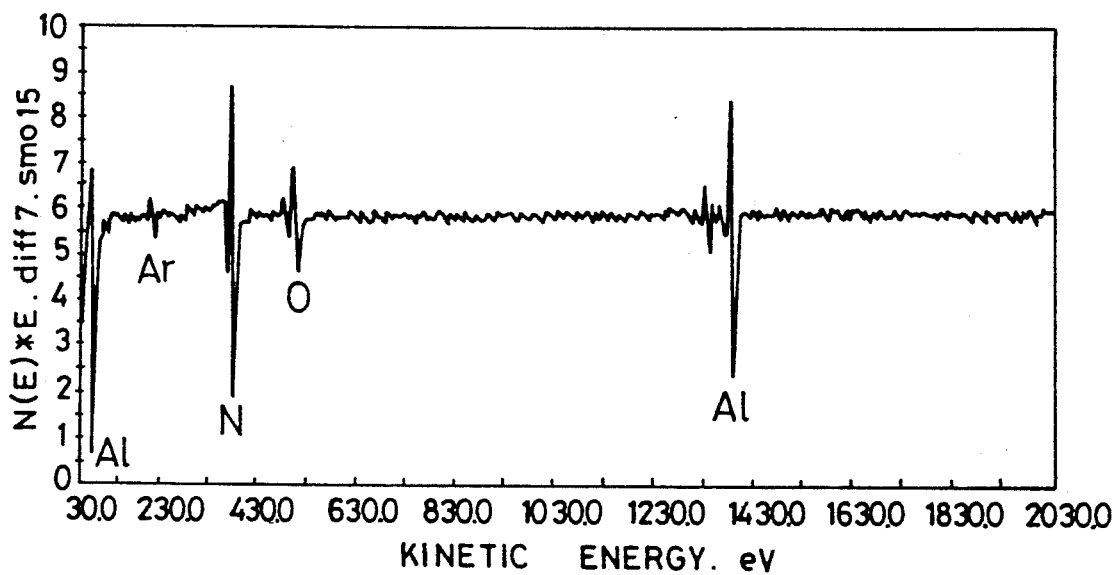
FIGS. 5 and 6 are graphs showing the results of the Auger spectral analysis conducted on the film formed on the forming surface of FIG. 3 to detect the wettability of the forming surface relative to a glass material.
Figure 6:
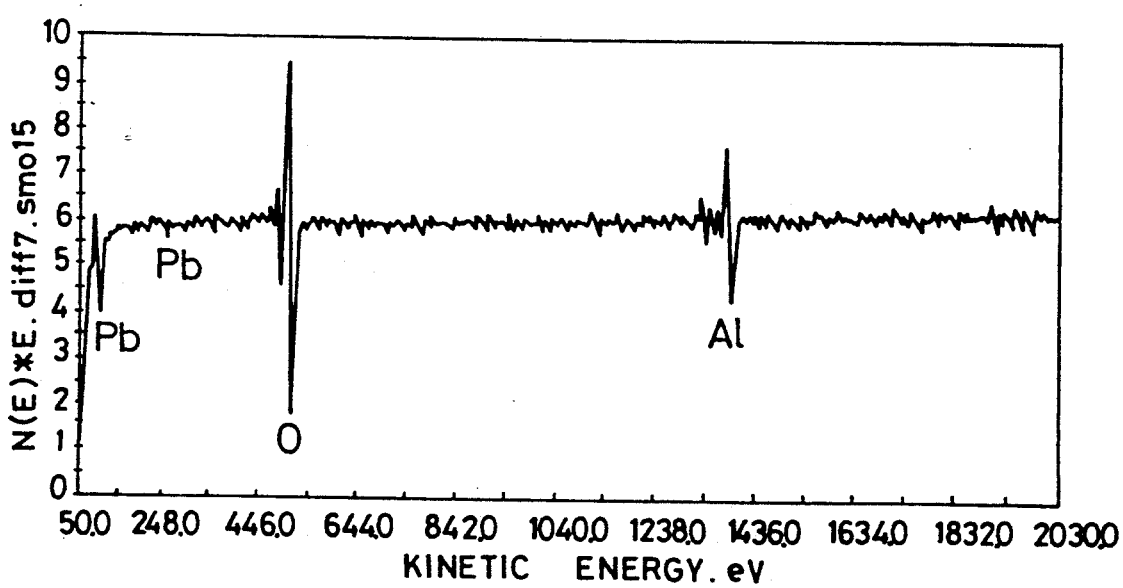
Figure 7:
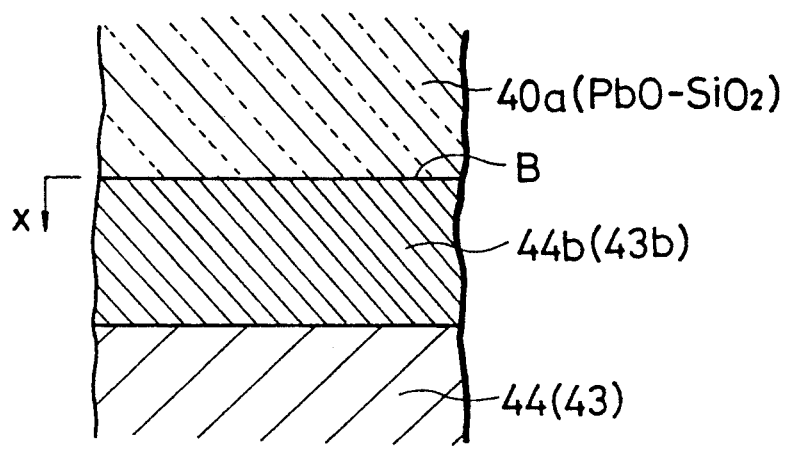
FIG. 7 is an enlarged cross-section of the essential parts of the forming member of FIG. 3 and a glass material.
Figure 8:
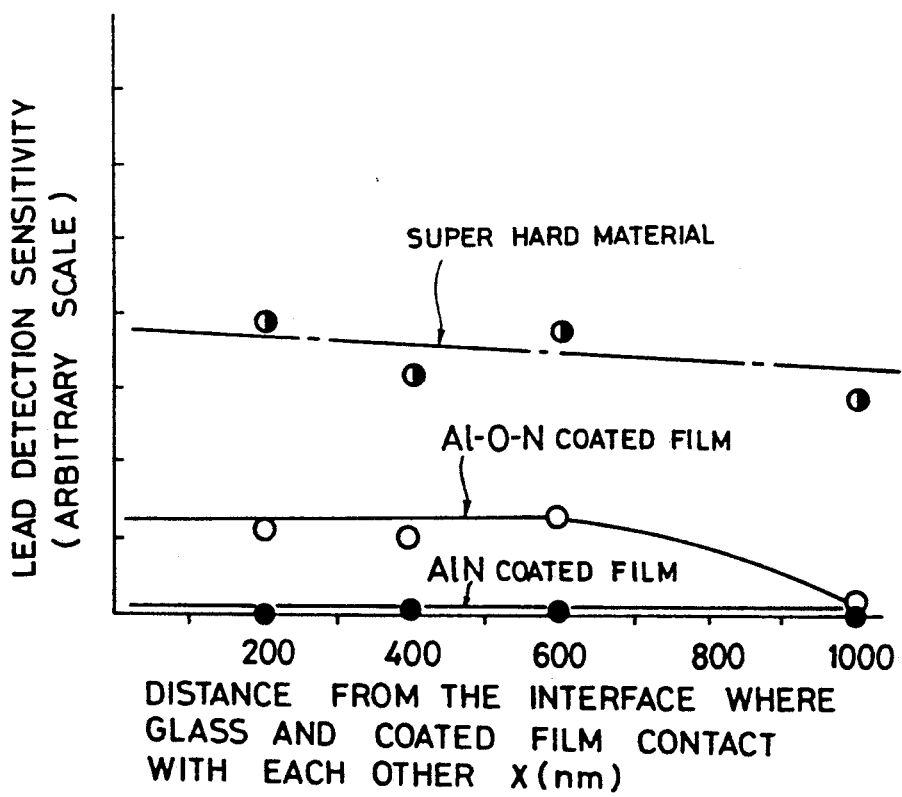
FIG. 8 is a graph showing the diffusion of the glass component into films of aluminum nitride and aluminum oxynitride which is the measure of wettability of the respective films.

Finally, the wettability of the film relative to the glass 40a (4) can be measured by conducting Auger spectral analysis on the films 43b and 44b coated on the forming surfaces 43a and 44a of the forming members 43 and 44. That is, FIGS. 5 and 6 are graphs showing the results of the Auger spectral analysis conducted on the aluminum nitride and aluminum oxynitride films formed on the forming surfaces to examine substances emitted from the films when sputtering was conducted thereon for ten minutes after the films were subjected to heating for 10 hours at 600° in the atmosphere. FIG. 8 is a graph showing the results of the Auger spectral analysis conducted on the films made of aluminum nitride (AlN) and aluminum oxynitride ($Al_xO_yN_z$) to examine distribution of the glass component (lead Pb) on a contact interface B between the glass ($PbO-SiO_2$) and the coated films 44b and 43b (in the direction of the depth of the films 44b and 43b (in the downward direction as viewed in FIG. 7) on the broken-out section (see FIG. 7) obtained after the glass 40a and the coated films 44b and 43b were heated for ten hours at 600° C. As is clear from FIG. 8, reaction with the glass greatly reduces in the film 44b or 43b which is in contact with the glass as compared with that in the super hard material which is in direct contact with the glass 40a. Also, among the AlN and $Al_xO_yN_z$ films, reaction with the glass is smaller in the AlN film than in the $Al_xO_yN_z$ film.

Thus, it is possible according to the present invention to manufacture a lens forming die whose forming surface exhibits high strength, heat-resistance and low surface roughness, which lacks the reaction to the glass, and which has a small wettability with the glass.

As will be understood from the foregoing description, it is possible according to the present invention to form on the forming surface of a forming member a film of aluminum nitride (AlN) or aluminum oxynitride ($Al_xO_yN_z$) which provides for good surface roughness at relatively low temperatures. It is therefore possible to manufacture a forming die whose forming surface exhibits high adhesion (strength), heat-resistance and low surface roughness and a small wettability relative to the forming material such as glass.

What is claimed is:

1. A method for producing an aluminum nitride film on a surface of a forming die comprising:
   positioning a microwave generating device to direct microwaves in a beam having a center of passage into a reaction chamber;
   positioning a gas inlet nozzle within said reaction chamber;
   positioning said forming die in said reaction chamber such that said surface is positioned outside of said beam and between said beam and said gas inlet nozzle such that said forming die is displaced from said center of passage by a first predetermined distance and is displaced a predetermined distance from said gas inlet nozzle;
   evacuating said reaction chamber;
   flowing a gas mixture containing a predetermined molar ratio of $AlBr_3$ to $N_2$ into said evacuated reaction chamber through said gas inlet nozzle; and
   emitting microwaves at a predetermined frequency from said microwave producing device into said reaction chamber such that a plasma region is formed within which the gas mixture reacts with said surface to form said aluminum nitride film at a temperature of 500° C. or lower.

2. A method of claim 1 wherein said first predetermined distance is 40 mm.

3. A method of claim 1 wherein said second predetermined distance is 40 mm.

4. A method of claim 1 wherein said predetermined molar ratio of $AlBr_3$ to $N_2$ is approximately 15.

5. A method of claim 1 wherein said predetermined frequency is approximately 2.45 GHz.

6. A method for producing an aluminum oxynitride film on a surface of a forming die comprising:

positioning a microwave generating device to direct microwaves in a beam having a center of passage into a reaction chamber;

positioning a gas inlet nozzle within said reaction chamber;

positioning said forming die in said reaction chamber such that said surface is positioned outside of said beam and between said beam and said gas inlet nozzle such that said forming die is displaced from said center of passage by a first predetermined distance and is displaced a predetermined distance from said gas inlet nozzle;

evacuating said reaction chamber;

flowing a gas mixture containing $AlBr_3$ and $N_2O$ into said evacuated reaction chamber through said gas inlet nozzle; and emitting microwaves at a predetermined frequency from said microwave producing device into said reaction chamber such that a plasma region is formed within which the gas mixture reacts with said surface to form said aluminum oxynitride film at a temperature of 500° C. or lower.

7. A method of claim 6 wherein said first predetermined distance is 40 mm.

8. A method of claim 6 wherein said second predetermined distance is 40 mm.

9. A method of claim 6 wherein said predetermined frequency is approximately 2.45 GHz.

* * * * *